United States Patent [19]
Kit

[11] Patent Number: 5,739,732
[45] Date of Patent: Apr. 14, 1998

[54] AC NOISE SPIKE SUPPRESSION CIRCUIT WITH PARALLEL BACK-TO-BACK FAST DIODES

[76] Inventor: Page Huie Man Kit, Rm. 1404, Singga Comm'l. Centre, 148 Connaught Road West, Hong Kong, Hong Kong

[21] Appl. No.: 589,961

[22] Filed: Jan. 23, 1996

[51] Int. Cl.⁶ .................................................. H03H 7/06
[52] U.S. Cl. ........................... 333/172; 333/181; 361/118
[58] Field of Search ........................... 333/12, 172, 181; 307/105; 327/309, 310, 311, 312, 313, 314, 320, 324, 325, 326, 551, 552; 361/56, 58, 111, 113, 118, 119

[56] References Cited

U.S. PATENT DOCUMENTS

| | | | |
|---|---|---|---|
| 3,305,801 | 2/1967 | Hartenstein | 333/172 X |
| 4,543,554 | 9/1985 | Muellenheim et al. | 333/12 X |
| 5,343,381 | 8/1994 | Boldoc et al. | 333/181 X |

FOREIGN PATENT DOCUMENTS

| | | | |
|---|---|---|---|
| 1279615 | 11/1989 | Japan | 333/181 |

OTHER PUBLICATIONS

Williams, *Power Electronics: Devices, Drivers, Applications and Passive Components*, 1987, pp. 60–64.

Primary Examiner—Robert Pascal
Assistant Examiner—Justin P. Bettendorf
Attorney, Agent, or Firm—Adam H. Tachner; Crosby, Heafey, Roach & May

[57] ABSTRACT

An alternating current (AC) spike absorption circuit employs a pair of back-to back parallel high-speed ultra-soft recovery diodes with unique RFI prevention characteristics. Further high frequency noise suppression is achieved by using a high voltage parallel-connected capacitor and a plurality of series-connected parallel ceramic-type resistors which are formed by resistors having coil windings providing an equivalent circuit of parallel resistance and inductance. The inductance provides ultra high frequency rejection and the resistance provides damping of any ringing oscillation. A surrounding ceramic material casing of the ceramic-type resistors resists the transmission of radio frequency energy.

6 Claims, 2 Drawing Sheets

AC NOISE SPIKE SUPPRESSION CIRCUIT WITH PARALLEL BACK-TO-BACK FAST DIODES

BACKGROUND OF THE INVENTION

1. Field of the Invention

The present invention relates generally to alternating current (AC) line noise suppression circuits and more specifically to an AC line noise spike suppression circuit which eliminates or substantially reduces ringing oscillation and provides excellent radio frequency interference (RFI) rejection.

2. Description of the Related Art

The following U.S. Patents are deemed relevant to the present invention:

U.S. Pat. No. 2,732,528 Anderson
U.S. Pat. No. 2,771,586 Toro
U.S. Pat. No. 3,305,801 Hartenstein
U.S. Pat. No. 3,515,945 Bohm
U.S. Pat. No. 4,191,986 Huang et al.
U.S. Pat. No. 4,264,940 Castle
U.S. Pat. No. 4,539,488 Lehnert
U.S. Pat. No. 4,539,617 Delaney et al.
U.S. Pat. No. 4,758,920 McCartney
U.S. Pat. No. 4,994,774 Joosse
U.S. Pat. No. 5,196,981 Kuo
U.S. Pat. No. 5,304,963 Shinjo U.S. Pat. No. 2,771,586 to Toro is directed to a noise suppression device comprised of a plurality of resonant circuits, each tuned to a sub-band and each incorporating a non-linear dynamic gain characteristic device. This reference also describes a mechanical equivalent of the electrical filter circuit. The all-electric device (FIG. 1) has in each sub-band a series coupling resistor 5 supplying the series resonant circuit with inductor 2 and capacitor 3. The series resonant filtered signal is fed to rectifiers 6 and 7 connected in back-to-back parallel producing a time varying filter network. A non-linear circuit may introduce spurious responses that are removed by a narrow bandpass series resonant circuit comprised of inductor 8 and capacitor 9.

U.S. Pat. No. 3,305,801 to Hartenstein is directed to a smoothing network incorporating a non-linear circuit for removing noise from pulse signals. The smoothing network (FIG. 1) comprises a non-linear circuit 11 in series and a capacitor 12 in shunt. The series non-linear element is formed from a pair of identical diodes 14 and 15 connected back-to-back parallel. This element has a voltage vs. current characteristic curve shown in FIG. 2. This non-linear element in conjunction with the capacitor acts as a peak detector and smooths the noisy pulse waveform.

U.S. Pat. No. 4,191,986 to Huang et al. is directed to a power line transient suppressor comprised of two diode inductor loop circuits. The circuit of FIG. 2 has diodes 24 and 25 connected to the input power in reverse parallel. Each diode supplies a winding 21 and 22 that may be mutually coupled. The circuits of FIGS. 3 and 4 and alternate diode coupled embodiments.

U.S. Pat. No. 4,264,940 to Castle is directed to using a non-linear device for circuit protection of equipment connected together with shielded cables and subject to abnormal electromagnetic surge voltages. Electrical systems 10 and 11 are interconnected by cable 16 having shield 20 with one end 21 connected to ground with the other end floating so as to prevent circulating currents and signal problems that would result if both ends were grounded. To protect from voltage surges, ungrounded end 22 has a protective network 32 connected between the shield and ground. A simple embodiment of the protective network is a pair of diodes 34 and 35 connected in parallel back-to-back.

U.S. Pat. No. 4,539,617 to Delaney et al is directed to an AC power line filter for low current applications that suppresses transients by decoupling the load from the line that for maximum filtering has a series inductor with a magnetic core that does not saturate. The circuit (FIG. 3) has element 31, a pair of diodes 32 and 33 connected back-to-back in series with an inductor connected between the line and load with a shunt capacitor as an output element. The non-linear element 31 provides for improved transient suppression.

It would be highly advantageous to provide an AC line noise suppression circuit which avoids use of an L/C-type low pass filter which otherwise creates ringing oscillations in response to noise spikes. Such ringing oscillations are especially inimical to AC loading circuits and particularly disadvantageous in audio and video circuits which are sensitive to low current signals. The prior art use of a pair of conventional low speed back-to-back diodes results only in a limiting of ringing oscillation, but does not eliminate such oscillation. Therefore, there is a continuing need for an AC line noise suppression circuit which avoids use of L/C-type low pass filters.

SUMMARY OF THE INVENTION

The present invention satisfies the aforementioned need by eliminating the ringing oscillation caused by prior art L/C-type filtering in reaction to noise spikes. The noise suppression circuit disclosed herein, replaces the inductor of L/C-type low pass filters with a semiconductor absorption circuit comprising a pair of high speed ultra-soft recovery diodes. Further high frequency suppression is enabled by use of a capacitor and at least one resistive absorption circuit, the latter comprising a ceramic-type resistor formed by a resistive coil winding and having an equivalent circuit of a resistor and parallel inductor. The inductor provides ultra high frequency rejection while the resistor provides damping to stop ringing oscillation.

In the preferred embodiment disclosed herein by way of illustration of the best mode contemplated, the semiconductor absorption circuit comprises a pair of back-to-back parallel connected fast diodes having a Di/Dt rate at least 20 Amps per microsecond and a reverse recovery time of about 50 nanoseconds. The semiconductor absorption circuit also comprises a ceramic-type resistor/inductive parallel pull-up circuit branch and a damping resistor. The resistive absorption circuit comprises a ceramic-type resistor/inductive pull-up and ultra-high frequency attenuation circuit. The two absorption circuits are interconnected at a shunt capacitor.

It is therefore a principal advantage of the present invention to provide an AC line noise suppression circuit which suppresses noise spikes without creating ringing oscillations.

It is an additional advantage of the present invention to provide an AC line noise suppression circuit which is particularly useful in suppressing noise in audio and video equipment which tends to be more sensitive to ringing oscillations.

It is still an additional advantage of the invention to provide an AC line noise suppression circuit which obviates the use of L/C-type low pass filters which otherwise create undesirable ringing oscillations.

It is still an additional advantage of the present invention to provide an AC line noise suppression circuit which employs a pair of high speed ultra-soft recovery diodes to replace the inductor of L/C-type low pass filters of the prior art.

BRIEF DESCRIPTION OF THE DRAWINGS

The aforementioned advantages of the invention, as well as additional advantages thereof, will be further understood as a result of a detailed description of the preferred embodiment when taken in conjunction with the accompanying drawings in which.

DETAILED DESCRIPTION OF A PREFERRED EMBODIMENT

Figure 1:
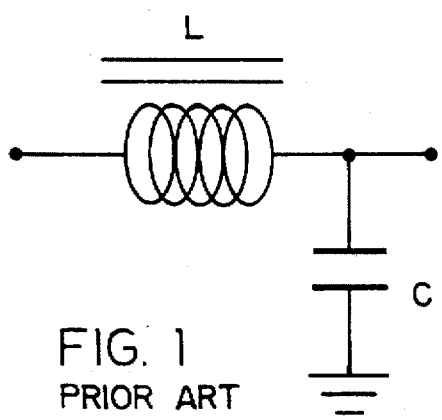
FIG. 1 is a schematic drawing of a prior art L/C-type low pass filter.
Figure 2:
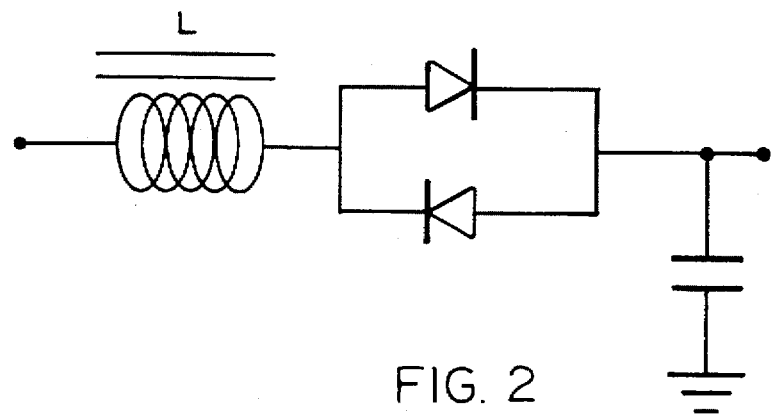
FIG. 2 is a schematic drawing of a prior art L/C-type low pass filter with a pair of conventional low speed, back-to-back diodes connected between the inductor and the capacitor as a limiter.

When a spike appears on an AC line, conventional noise suppression circuits employing an L/C-type low pass filter of the type shown in the prior art in FIG. 1, create a ringing oscillation which then appears on the AC line. Prior art attempts to limit this ringing oscillation, such as connecting a pair of normal low speed back-to-back diodes as shown in FIG. 2, only limit or clip the peaks of the unwanted oscillation. Such ringing oscillation is harmful to most AC loading circuits, especially audio and video circuitry, which is low current signal sensitive. The oscillation is at the resonant fundamental and harmonic frequencies of the L/C circuit. The conventional back-to-back diodes are intended to dampen the ringing oscillations of the L/C circuit by limiting the current below the breakdown voltage of the diodes. However, conventional diodes have a relatively slow recovery time and poor spike noise damping characteristics. Accordingly, spike noise, which is produced with every cycle of input current, cannot be properly reduced with conventional diodes.

Figure 4:
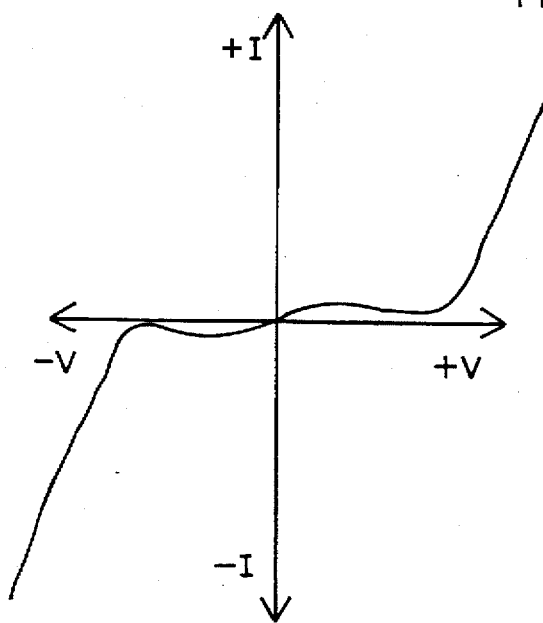
FIG. 4 is a graphical representation of the voltage/current characteristic of the high speed diodes used in the circuit of FIG. 3.
Figure 3:
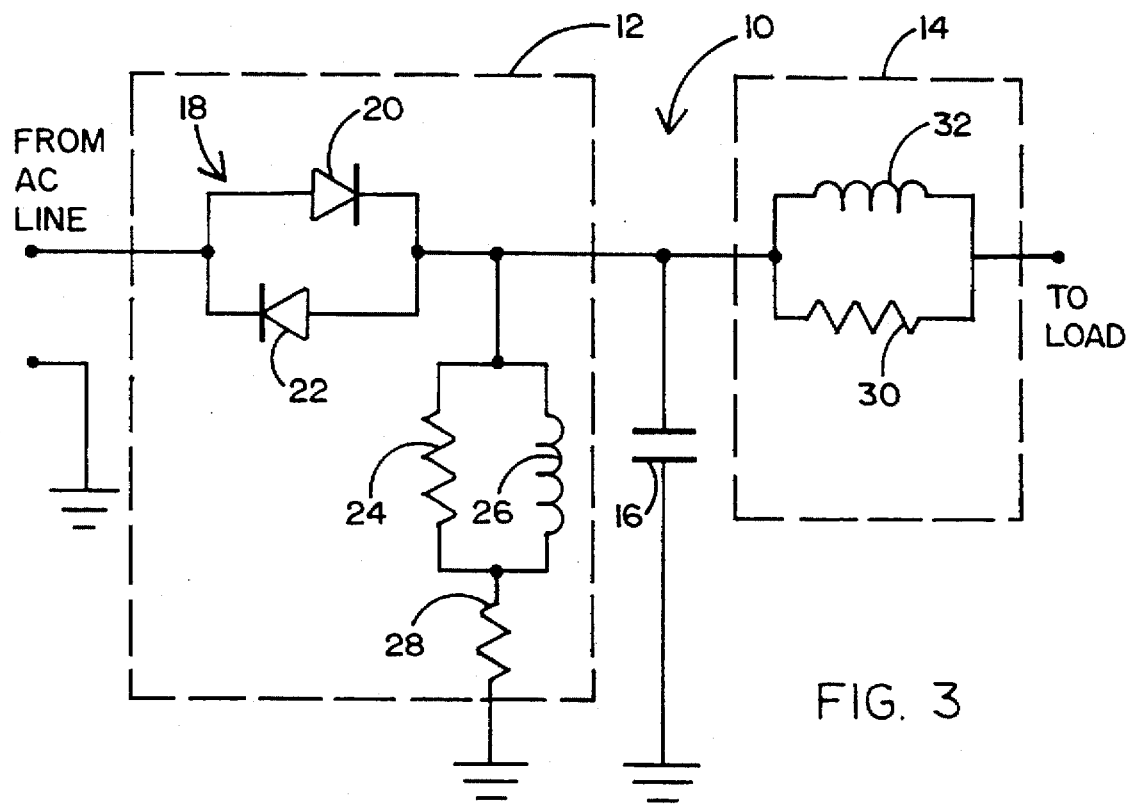
FIG. 3 is a schematic drawing of a preferred embodiment of the present invention.

Referring now to FIG. 3, it will be seen that a preferred embodiment 10 of the present invention comprises a semiconductor absorption circuit 12, a resistor absorption circuit 14 and a parallel capacitor 16. Absorption circuit 12 includes a parallel pair 18 of high speed, ultra-soft recovery diodes 20 and 22. One example of such a diode is a GI 1851 which has the V-I characteristic shown in FIG. 4. Diode 20 is a fast diode that passes through the positive cycle of the incoming AC current in accordance with the V-I characteristic of FIG. 4. Diode 22 is a fast diode that functions identically to diode 20 but through the negative cycle of the incoming AC current in accordance with the V-I curve of FIG. 4. Diodes 20 and 22 should have a Di/Dt rate of at least 20 Amps per microsecond and a reverse recovery time of no more than about 50 nanoseconds. As used herein, the terms "fast," "high speed" and "ultra soft recovery" when used in reference to diodes 20 and 22, refer to these performance criteria. Of course, it will be understood that diodes having higher Di/Dt rates and faster recovery times are also suitable for use in the invention and are deemed to be within the above-defined terms.

Figure 5:
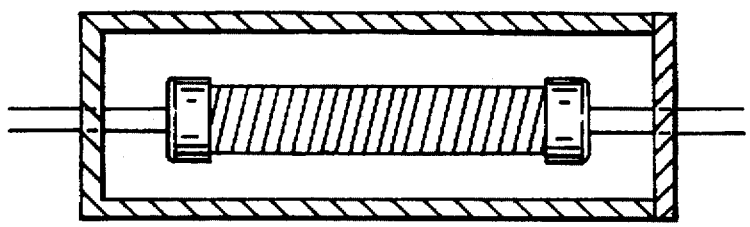
FIG. 5 is a schematic representation of a ceramic resistor used in the present invention.

Also included in the preferred embodiment of the semiconductor absorption circuit 12 are a resistor 24, an inductor 26 and a resistor 28. This L/R circuit is preferably implemented in part by using a ceramic-type AC power resistor. Such a resistor is shown structurally in FIG. 5. As seen therein, a ceramic power resistor comprises a suitable resistor around which a coil of wire is wound to form an inductor connected in parallel with the resistor. The combined resistor/inductor is enclosed in a ceramic material that resists transmission of radio frequency interference (RFI). Typical values for the inductors 26 and 32 of the power line resistors are 0.5 microHenry and a DC resistance of 0.1 Ohms. The inductor 26 is used to "pull up" the rising edge potential of the incoming noise spike thereby making the output side (cathode) of the positive-going diode 20 more positive than the input side (anode) of the positive-going diode when the incoming AC current is in the positive portion of its cycle. Subject to the V-I characteristic of FIG. 4, this will alternate the input spike current due to negative biasing of the diode. The negative-going diode 22 responds the same way in combination with the "pull up" circuit (24, 26, 28).

Resistor absorption circuit 14 also compromises a ceramic-type AC power resistor having a resistor 30 and inductance 32 connected in a series circuit configuration with the absorption circuit 12. Circuit 14 is also an inductive rising edge pull-up circuit which further attenuates the incoming noise spike by means of its inherent high frequency impedance. Capacitor 16 (typically a 0.1 microFarad ceramic type) is a parallel-connected high frequency shunt which further attenuates the incoming spike. Resistors 24 and 30 serve as damping resistors to stop any ringing oscillations. They may be omitted when the inductances of coils 26 and 32 are small such as for low signal audio and video applications.

From the foregoing description it will now be apparent to those having ordinary skill in the relevant art that the present invention provides improved noise spike absorption circuit resulting from obviating prior art L/C low pass filters (which produce highly undesirable ringing oscillations) by instead providing a novel combination of three different types of noise spike absorption devices. These absorption devices provide:

a) Diode absorption by fast breakdown diodes connected in back-to-back parallel arrangement;

b) ceramic capacitor absorption by high frequency shunt attenuation; and c) AC ceramic power resistor absorption by a ceramic-material-enclosed L/R device which attenuates noise spikes by high frequency impedance and energy absorption through reflection and insertion loss in the surrounding ceramic material.

Having thus disclosed a preferred embodiment of the invention, it being understood that the disclosed embodiment is only exemplary of the invention and not necessarily limiting of the scope of protection provided herein, what is claimed is:

1. A noise spike suppression circuit for connection between AC line and a load; the suppression circuit comprising:

a pair of fast diodes connected back-to-back in parallel with each other and in series with said AC line;

a first inductor connected in shunt with said fast diodes;

a capacitor connected in shunt with said fast diodes; and a second inductor connected in series with said fast diodes;

said first and second inductors each being encased within a material that is resistant to the transmission of radio frequency energy;

and further comprising a damping resistor connected in parallel with said first inductor.

2. The noise spike suppression circuit recited in claim 1 further comprising a damping resistor connected in parallel with said second inductor.

3. The noise spike suppression circuit recited in claim 2 wherein said second inductor and said parallel damping resistor comprise a unitary component having a coil wound around a resistor.

4. The noise spike suppression circuit recited in claim 1 further comprising a pair of damping resistors, one such resistor being connected in parallel with said first inductor and another such resistor being connected in parallel with said second inductor.

5. The noise spike suppression circuit recited in claim 4 wherein each of said first and second inductors and its respective parallel damping resistor comprise a unitary component having a coil wound around a resistor.

6. The noise spike suppression circuit recited in claim 1 wherein said first inductor and said parallel damping resistor comprise a unitary component having a coil wound around a resistor.

* * * * *

UNITED STATES PATENT AND TRADEMARK OFFICE
CERTIFICATE OF CORRECTION

PATENT NO. : 5,739,732
DATED : April 14, 1998
INVENTOR(S) : Page Man Kit Huie

It is certified that error appears in the above-identified patent and that said Letters Patent is hereby corrected as shown below:

Title page,
Item [76], Inventor, "Kit, Page Huie Man" should read -- Huie, Page Man Kit --

Signed and Sealed this

Twenty-seventh Day of July, 2004

JON W. DUDAS
*Acting Director of the United States Patent and Trademark Office*